US010529847B2

(12) United States Patent
Hsu (10) Patent No.: US 10,529,847 B2
(45) Date of Patent: Jan. 7, 2020

(54) TRENCH POWER SEMICONDUCTOR COMPONENT AND METHOD OF MANUFACTURING THE SAME

(71) Applicant: SUPER GROUP SEMICONDUCTOR CO., LTD., Hsinchu County (TW)

(72) Inventor: Hsiu-Wen Hsu, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 16/111,382

(22) Filed: Aug. 24, 2018

(65) Prior Publication Data

US 2019/0103489 A1 Apr. 4, 2019

(30) Foreign Application Priority Data

Sep. 29, 2017 (TW) .............................. 106133739 A (51) Int. Cl.
*H01L 29/78* (2006.01)
*H01L 29/40* (2006.01)
*H01L 21/02* (2006.01)
*H01L 29/66* (2006.01)
*H01L 29/51* (2006.01)

(52) U.S. Cl.
CPC .... *H01L 29/7813* (2013.01); *H01L 21/02236* (2013.01); *H01L 29/407* (2013.01); *H01L 29/513* (2013.01); *H01L 29/66734* (2013.01)

(58) Field of Classification Search
None
See application file for complete search history.

(56) References Cited

U.S. PATENT DOCUMENTS 8,497,549 B2 7/2013 Madson
2012/0025303 A1* 2/2012 Hirler ................... H01L 29/407
257/330

FOREIGN PATENT DOCUMENTS

TW 200739695 10/2007
TW 200834745 8/2008
TW 201027628 A1 7/2010
TW 201624706 A 7/2016

* cited by examiner

*Primary Examiner* — Anthony Ho
*Assistant Examiner* — Kevin Quinto
(74) *Attorney, Agent, or Firm* — Li & Cai Intellectual Property (USA) Office (57) ABSTRACT

The present disclosure provides a trench power semiconductor component and a method of manufacturing the same. The trench gate structure of the trench power semiconductor component includes a shielding electrode, a gate electrode disposed above the shielding electrode, and an inter-electrode dielectric layer. Before the formation of the inter-electrode dielectric layer, the step of forming the trench gate structure includes: forming a laminated structure covering the inner wall surface of the cell trench, in which the laminated structure includes a semiconductor material layer and an initial inner dielectric layer covering the semiconductor material layer; forming a heavily-doped semiconductor material in the lower part of the cell trench; and removing a portion of the initial inner dielectric layer located at an upper part of the cell trench to expose an upper half portion of the semiconductor material layer and a top portion of the heavily doped semiconductor material.

18 Claims, 8 Drawing Sheets

TRENCH POWER SEMICONDUCTOR COMPONENT AND METHOD OF MANUFACTURING THE SAME

BACKGROUND OF THE INVENTION

1. Field of the Invention

The present disclosure relates to a trench power semiconductor component and a method of manufacturing the same; more particularly, to a trench power semiconductor component having a shielding electrode and a method of manufacturing the same.

2. Description of Related Art

Power loss in a conventional power metal oxide semiconductor field transistor (Power MOSFET) can be classified into two types, switching loss and conduction loss. Drain-to-gate capacitance is an important parameter in switching loss. A high drain-to-gate capacitance leads to an increase in switching loss, thereby limiting the switching rate of power MOSFETs. Therefore, a power MOSFET of high gate-to-drain capacitance is not suitable for high frequency circuits.

Power MOSFETs in the prior art include a shielding electrode located in the lower half part of the gate trench so as to reduce the gate-to-drain capacitance and increase the breakdown voltage without adversely affecting the on-resistance. On the other hand, higher breakdown voltage allows the doping concentration of the epitaxial layer to be higher so as to reduce the on-resistance.

Figure 1:
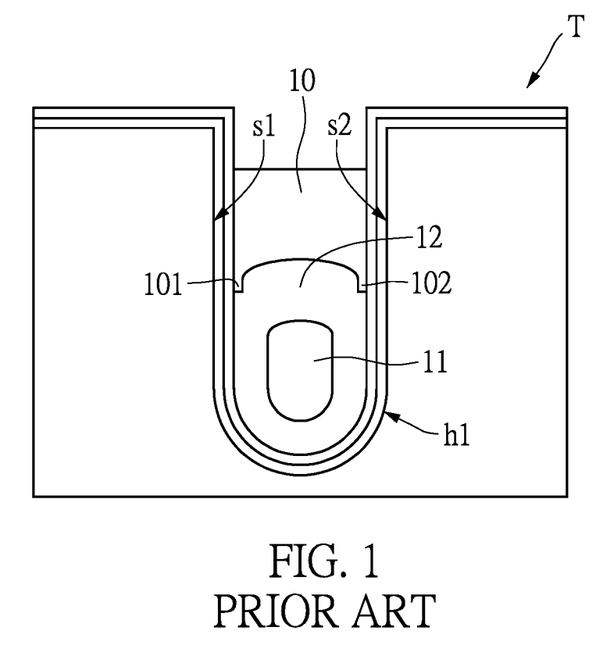
FIG. 1 is a partial schematic view of a conventional trench power MOSFET.

Reference is made FIG. 1, which partially shows a cross-sectional view of a conventional trench power MOSFET. In the conventional trench power MOSFET T, two recess regions are formed at the top surface of the inter-electrode dielectric layer 12 during a thermal oxidation process for forming the inter-electrode dielectric layer 12 between a gate 10 and a shielding electrode 11, the two recess regions being respectively near two sidewall surfaces s1, s2 of the trench h1. As such, the gate 10 formed in a subsequent step will have two sharp protrusions 101, 102 located at the bottom side thereof and respectively filling the two recess regions. The two sharp protrusions 101, 102 of the gate 10 may cause higher electric field strength, thereby reducing the withstand voltage and the reliability of the trench power MOSFET.

SUMMARY OF THE INVENTION

Accordingly, the present disclosure provides a trench power semiconductor component and a method of manufacturing the same that can avoid the formation of recess regions at the inter-electrode dielectric layer by forming a semiconductor material layer before the step of forming the inter-electrode dielectric layer.

One embodiment of the present disclosure provides a trench power semiconductor component including a substrate, an epitaxial layer, and a trench gate structure. The epitaxial layer is disposed on the substrate, the epitaxial layer having at least one cell trench formed therein. The trench gate structure is located in the at least one cell trench. The trench gate structure includes an outer insulating layer, a shielding electrode, a gate electrode, and a laminated shielding layer. The outer insulating layer covers an inner wall surface of the cell trench. The shielding electrode is located in a lower part of the cell trench. The gate electrode is disposed above the shielding electrode and insulated from the shielding electrode. The laminated shielding layer covers a lower inner surface of the outer insulating layer, and the laminated shielding layer at least includes a semiconductor layer that is spaced apart from the shielding layer and interposed between the lower inner surface and the shielding electrode.

Another embodiment of the present disclosure provides a method of manufacturing a trench power semiconductor component. The method includes: forming an epitaxial layer on a substrate; forming a cell trench in the epitaxial layer; and forming a trench gate structure in the cell trench, in which the trench gate structure includes a shielding electrode, a gate electrode disposed above the shielding electrode, and an inter-electrode dielectric layer interposed between the shielding electrode and the gate electrode. Before the inter-electrode dielectric layer is formed, the step of forming the trench gate structure in the trench further at least includes: forming a laminated structure covering an inner wall surface of the cell trench, the laminated structure at least including a semiconductor material layer and an initial inner dielectric layer covering the semiconductor material layer; forming a heavily-doped semiconductor material in a lower part of the cell trench; and removing a part of the initial inner dielectric layer located in an upper part of the cell trench to expose an upper half portion of the semiconductor material layer and a top portion of the heavily doped semiconductor material.

In summary, the present disclosure provides the trench power semiconductor component and the method of manufacturing the same. By forming the laminated structure covering the inner wall surface of the cell trench before the formation of the inter-electrode dielectric layer, in which the laminated structure at least includes a semiconductor material layer and an initial inner dielectric layer covering the semiconductor material layer, the formation of a recess region on the top surface of the inter-electrode dielectric layer can be avoided, the inter-electrode dielectric layer being formed in a subsequent step. Since there is no recess region formed on the top surface of the inter-electrode dielectric layer, the gate electrode can be formed without any sharp protrusion. In this way, the trench power semiconductor component fabricated by the method provided in the embodiments of the present disclosure can withstand higher gate voltage and the reliability thereof can be enhanced.

For further understanding of the present disclosure, the following embodiments are provided along with illustrations to facilitate the disclosure of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure will be illustrated in the following description and appended drawings. In these drawings, like references indicate similar elements.

It will be understood that, although the terms first, second, third, and the like, may be used herein to describe various elements, these elements should not be limited by these terms. These terms are only to distinguish one element from another element, and the first element discussed below could be termed a second element without departing from the teachings of the instant disclosure. As used herein, the term "and/or" includes any and all combinations of one or more of the associated listed items.

Firstly, the method of manufacturing a trench power semiconductor component according to one embodiment of the present disclosure is described in detail below. Referring to FIG. 2 and FIGS. 3A to 3F, FIG. 2 is a flow chart of a method of manufacturing a trench power semiconductor component according to an embodiment of the present disclosure. FIGS. 3A to 3F are partial sectional schematic views of a trench power semiconductor component in different steps of the method shown in FIG. 2 according to one embodiment of the present disclosure.

Figure 2:
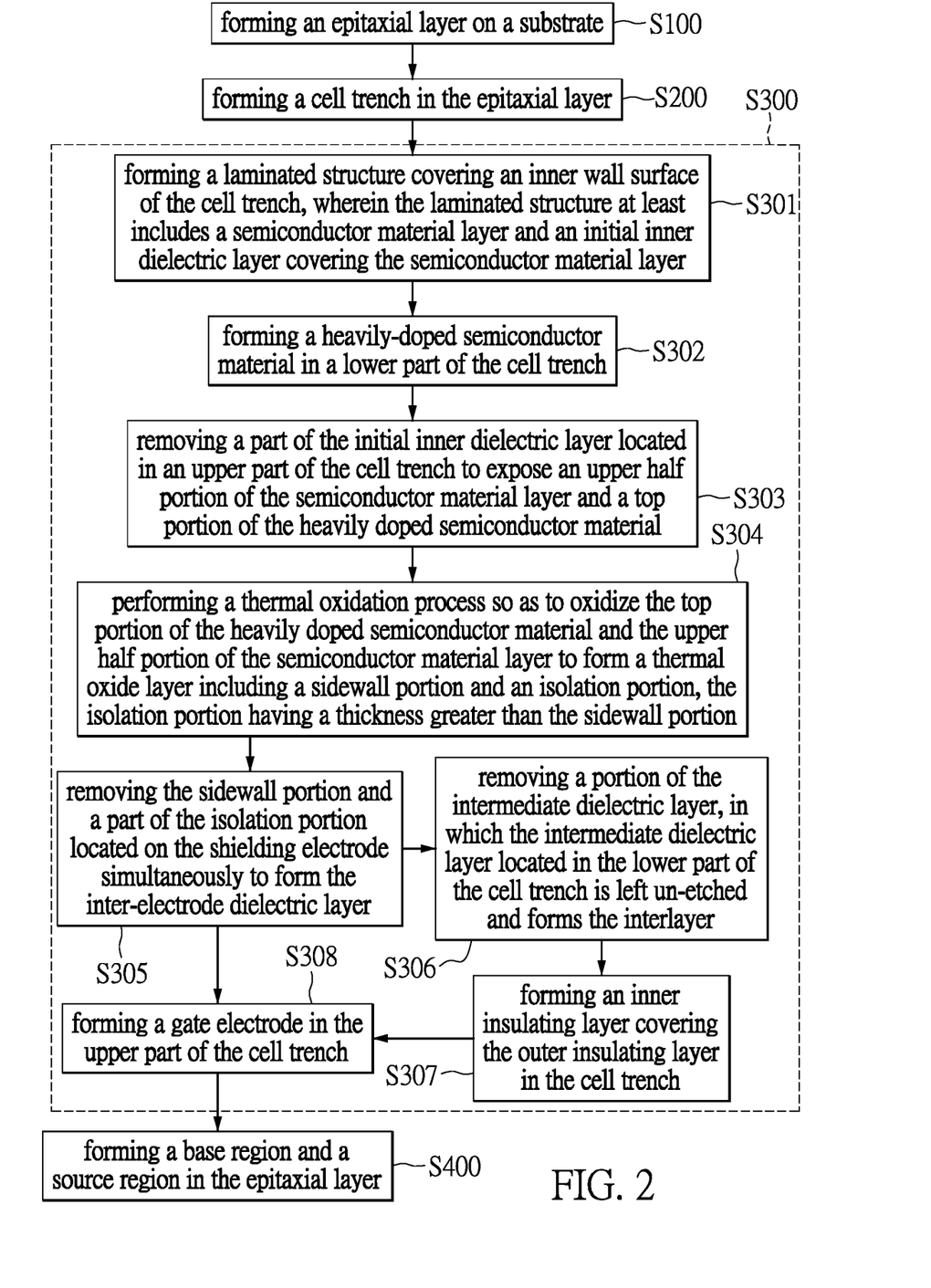
FIG. 2 is a flow chart of a method of manufacturing a trench power semiconductor component according to an embodiment of the present disclosure.

As shown in FIG. 2, in step S100, an epitaxial layer is formed on a substrate. Next, in step S200, a cell trench is formed in the epitaxial layer. Subsequently, in step S300, a trench gate structure is formed in the cell trench.

Referring to steps S301 to S306 shown in FIG. 2 and referring to FIGS. 3A to 3F, the detailed steps for forming the trench gate structure will be disclosed in the following description.

Figure 3A:
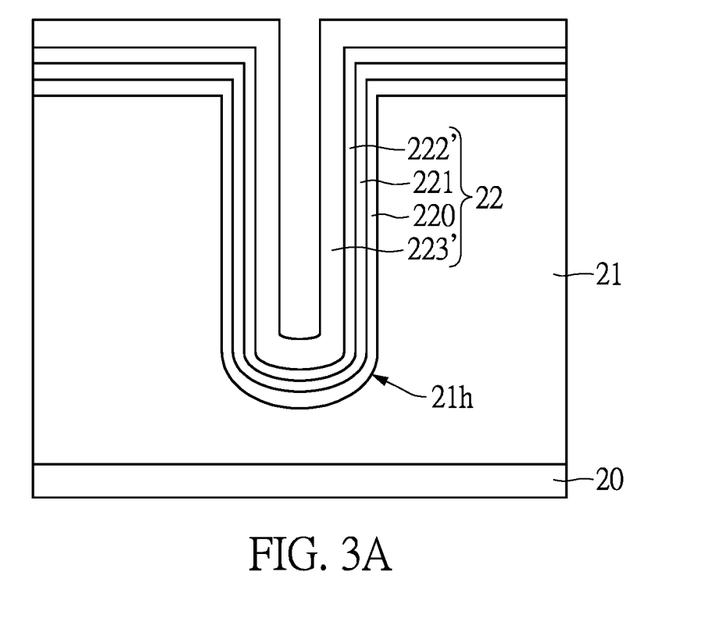
FIG. 3A is a partial schematic view of a trench power semiconductor component in the step S301 of the method shown in FIG. 2 according to one embodiment of the present disclosure.

In step S301, a laminated structure covering an inner wall surface of the cell trench is formed, in which the laminated structure at least includes a semiconductor material layer and an initial inner dielectric layer covering the semiconductor material layer. Before the step shown in FIG. 3A, the steps S100, S200 and S301 shown in FIG. 2 are sequentially performed. As shown in FIG. 3A, the epitaxial layer 21 is formed on the substrate 20 and has the cell trench 21h, and the laminated structure 22 covers the inner wall surface of the cell trench 21h.

Specifically, the substrate 20 is heavily doped with first conductivity type impurities to serve as a drain region of the trench power semiconductor component. The aforementioned first conductivity-type impurities can be N-type or P-type impurities. Assuming that the substrate 20 is a silicon substrate, the N-type impurities can be Group V element ions, such as phosphate ions or arsenic ions, and P-type impurities can be Group III element ions, such as boron ions, aluminum ions or gallium ions.

The conductivity type of the epitaxial layer 21 is the same as that of the substrate 20, but the doping concentration in the epitaxial layer is lower than that in the substrate 20. Taking an NMOS transistor as an example, the substrate 20 is doped with N-type impurities of relatively high doping concentration and the epitaxial layer 21 is doped with N-type impurities of relatively low doping concentration. Taking a PMOS transistor as an example, the substrate 20 is doped with P-type impurities of relatively high doping concentration and the epitaxial layer 21 is doped with P-type impurities of relatively low doping concentration.

Furthermore, the cell trench 21h can be formed by any well-known means. For example, a patterned photoresist (not shown in the figure) can be firstly formed on the epitaxial layer 21 to define the position of the cell trench 21h, but the present disclosure is not limited to the example provided herein. Next, an opening is formed through the patterned photoresist, and then an etching process, such as a wet etching process or a dry etching process, is performed so as to form the cell trench 21h in the epitaxial layer 21.

In the embodiment of the present disclosure, the laminated structure 22 includes an outer insulating layer 220, an intermediate dielectric layer 221, a semiconductor material layer 222', and an initial inner dielectric layer 223'. Specifically, the outer insulating layer 220, the intermediate dielectric layer 221, the semiconductor material layer 222', and the initial inner dielectric layer 223' are sequentially formed to cover the inner wall surface of the cell trench 21h and the surface of the epitaxial layer 21. That is to say, the intermediate dielectric layer 221 and the semiconductor material layer 222' are interposed between the outer insulating layer 220 and the initial inner dielectric layer 223', and the semiconductor material layer 222' is interposed between the intermediate dielectric layer 221 and the initial inner dielectric layer 223'.

In the present embodiment, the material of the outer insulating layer 220 is different from that of the intermediate dielectric layer 221. In one embodiment, the outer insulating layer 220 is an oxide layer, such as a silicon oxide layer, and the intermediate dielectric layer 221 is a nitride layer, such as a silicon nitride layer. Furthermore, the material of the intermediate dielectric layer 221 is different from that of the outer insulating layer 220 so that the outer insulating layer 220 can be protected by the intermediate dielectric layer 221 from being etched during a subsequent etching process.

It should be noted that after the intermediate dielectric layer 221 is formed, the step of forming the semiconductor material layer 222' to cover the intermediate dielectric layer 221 is prior to the step of forming the initial inner dielectric layer 223'. In one embodiment, the semiconductor material layer 222' can be an intrinsic semiconductor layer that serves as an insulator. However, in another embodiment, the semiconductor material layer 222' can be a doped semiconductor layer. For example, the semiconductor material layer 222' can be a doped N-type or P-type polysilicon layer that is a conductor, but the present disclosure is not limited to the examples provided herein. Furthermore, it is preferable for the semiconductor material layer 222' to be as thin as possible.

The material of the initial inner dielectric layer 223' is the same as that of the outer insulating layer 220, i.e., both the initial inner dielectric layer 223' and the outer insulating layer 220 are oxide layers. In the present disclosure, the thickness of the initial inner dielectric layer 223' is greater than that of the semiconductor material 222'. However, the cell trench 21h is not completely filled with the initial inner dielectric layer 223' so as to define a space left unfilled by the initial inner dielectric layer 223 in the cell trench 21h'.

Figure 3B:
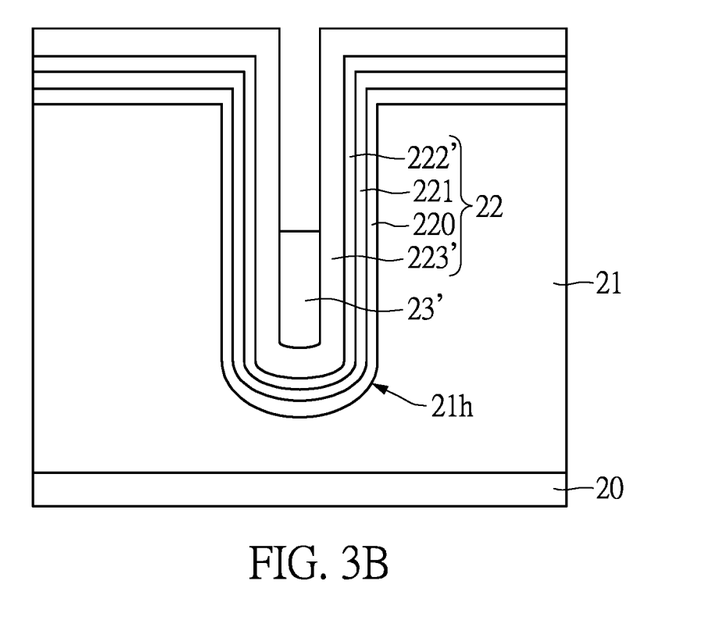
FIG. 3B is a partial schematic view of a trench power semiconductor component in the step S302 of the method shown in FIG. 2 according to one embodiment of the present disclosure.

Referring to FIG. 2 and FIG. 3B, FIG. 3B is a partial schematic view of a trench power semiconductor component in the step S302 of the method shown in FIG. 2 according to one embodiment of the present disclosure. In step S302, a heavily doped semiconductor material is formed in the lower part of the cell trench. As shown in FIG. 3B, the heavily doped semiconductor material 23' is formed in the space defined by the initial inner dielectric layer 223' and located in the lower part of the cell trench 21h.

In one embodiment, a heavily doped semiconductor layer is formed on the epitaxial layer 21 and fills into the cell trench 21h, and then the heavily doped semiconductor layer is etched back to remove a portion of the heavily doped semiconductor layer on the surface of the epitaxial layer 21. As such, the heavily doped semiconductor material 23' is left un-etched and located in the lower part of the cell trench 21h. The heavily doped semiconductor material 23' can be a doped polysilicon containing conductivity impurities. In one embodiment, the heavily doped semiconductor layer can be formed by an in-situ doping CVD process.

Next, referring to FIG. 2, in step S303, a part of the initial inner dielectric layer located in an upper part of the cell trench is removed to expose an upper half portion of the semiconductor material layer and a top portion of the heavily doped semiconductor material.

Figure 3C:
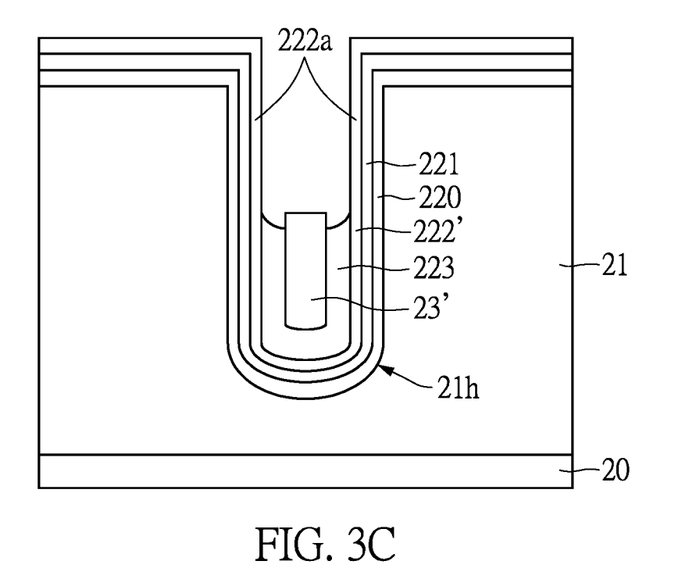
FIG. 3C is a partial schematic view of a trench power semiconductor component in the step S303 of the method shown in FIG. 2 according to one embodiment of the present disclosure.

Referring to FIG. 2 in conjunction with FIG. 3C, FIG. 3C is a partial schematic view of a trench power semiconductor component in the step S303 of the method shown in FIG. 2 according to one embodiment of the present disclosure. After the part of the initial inner dielectric layer 223' located in an upper part of the cell trench 21h is removed, the remaining part of the initial inner dielectric layer 223' located in the lower part of the cell trench 21h forms an inner dielectric layer 223. Furthermore, the upper half portion 222a of the semiconductor material layer 222' and the top portion of the heavily doped semiconductor material 23' are exposed. To be more specific, the top portion of the heavily doped semiconductor material 23' protrudes above the top surface of the inner dielectric layer 223.

Figure 3D:
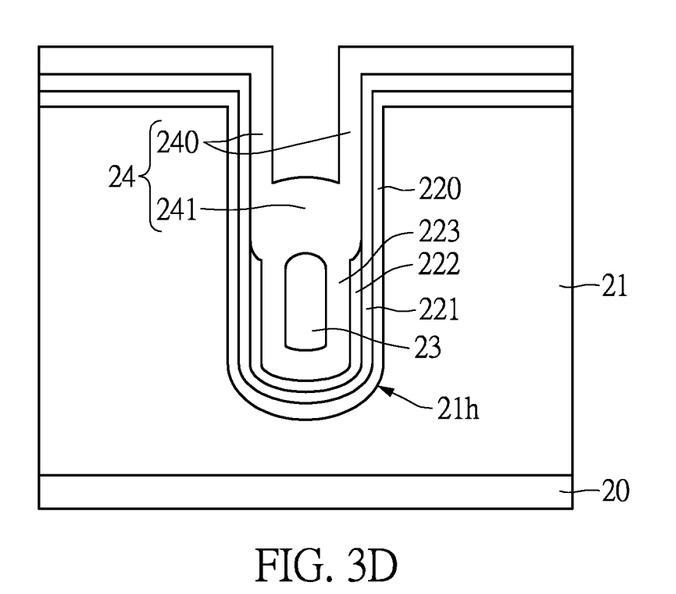
FIG. 3D is a partial schematic view of a trench power semiconductor component in the step S304 of the method shown in FIG. 2 according to one embodiment of the present disclosure.

Subsequently, in step S304 shown in FIG. 2, a thermal oxidation process is performed so that the top portion of the heavily doped semiconductor material and the upper half portion of the semiconductor material layer are oxidized to form a thermal oxide layer. Referring to FIG. 3D, FIG. 3D is a partial schematic view of a trench power semiconductor component in the step S304 of the method shown in FIG. 2 according to one embodiment of the present disclosure.

As shown in FIG. 3D, after the thermal oxidation process is performed, both the upper half portion 222a of the semiconductor material layer 222' and the top portion of the heavily doped semiconductor material 23' are oxidized to form the thermal oxide layer 24. It should be noted that the lower half portion of the semiconductor material layer 222' located in the lower part of the cell trench 21h is covered by the inner dielectric layer 223, and thus is not oxidized. That is to say, the un-oxidized portion of the semiconductor material layer 222' forms a semiconductor layer 222. Furthermore, the un-oxidized portion of the heavily doped semiconductor material 23' forms a shielding electrode 23. Accordingly, the semiconductor layer 222 is interposed between the intermediate dielectric layer 221 and the shielding electrode 23.

As shown in FIG. 3D, the thermal oxide layer 24 includes two opposite sidewall portions 240 and an isolation portion 241 connected between the two opposite sidewall portions 240. Each of the two opposite sidewall portions 241 extends along a depth direction of the cell trench 21h and covers each of the two upper portions of the intermediate dielectric layer 221. The isolation portion 241 is disposed on both of the shielding electrode 23 and the semiconductor layer 222. In the present disclosure, a thickness of the isolation portion 241 is greater than that of each sidewall portion 240.

It should be noted that during the process of thermal oxidation, in the absence of the intermediate dielectric layer 221 that covers the epitaxial layer 21, silicon atoms in the epitaxial layer 21 would continuously diffuse and oxidize, causing each of the two sidewall portions 240 to have a greater thickness than the isolation portion 241. Accordingly, in the present embodiment, the intermediate dielectric layer 221 that covers the outer insulating layer 220 and the epitaxial layer 21 can prevent the epitaxial layer 21 from being further oxidized, such that the thickness of the sidewall portions 240 of the thermal oxide layer 24 can be controlled to fall within a predetermined range.

Figure 3E:
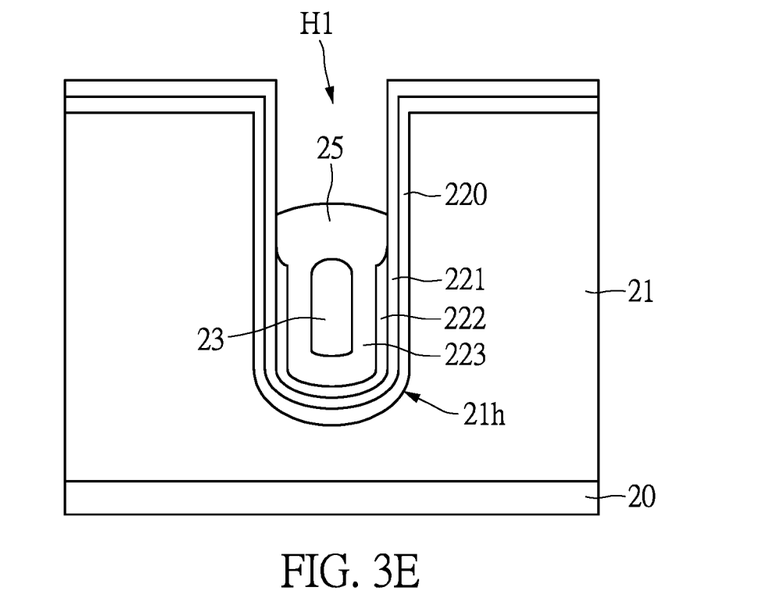
FIG. 3E is a partial schematic view of a trench power semiconductor component in the step S305 of the method shown in FIG. 2 according to one embodiment of the present disclosure.

Subsequently, in the step S305 shown in FIG. 2, the side portions and a part of the isolation portion are removed simultaneously to form an inter-electrode dielectric layer. Reference is made to FIG. 3E, which is a partial schematic view of a trench power semiconductor component in the step S305 of the method shown in FIG. 2 according to one embodiment of the present disclosure.

As shown in FIG. 3E, each of the sidewall portions 240 is removed completely. Since the thickness of the isolation portion 241, is greater than that of each sidewall portion 240, a portion of the isolation portion 241 will be left un-etched even when the sidewall portions 240 are removed completely. In the present embodiment, after the step of removing the sidewall portions 240, the un-etched portion of the isolation portion 241 would have a thickness larger than 70 nm so as to serve as the inter-electrode dielectric layer 25 that isolates the shielding electrode 23 from the gate electrode 26.

Additionally, if the thickness of the semiconductor material layer 222' is 10 nm, the thickness of each sidewall portion 240 can be about 22.7 nm, but the present disclosure is not limited to the example provided herein. Accordingly, the thickness of each sidewall portion 240 can be limited within a predetermined range by controlling the thickness of the semiconductor material layer 222'

Furthermore, after the sidewall portions 240 of the thermal oxide layer 24 are removed, the inter-electrode dielectric layer 25 and the intermediate dielectric layer 221 jointly define an arrangement space H1 in the upper part of the cell trench 21*h*.

Next, referring to FIG. 2, in one embodiment, after the procedures of the step S305, the method can directly proceed to the step S308. In another embodiment, however, the method may proceed to the step S308 after the steps S306 and S307 have been performed.

In the present embodiment, after the procedures of the step S305, the method directly proceeds to the step S308, in which the gate electrode is formed in the upper part of the cell trench.

Figure 3F:
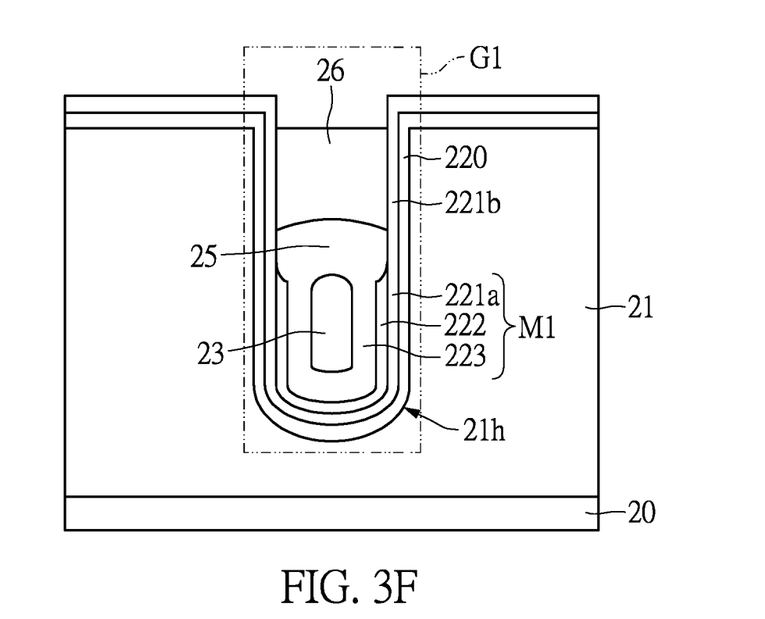
FIG. 3F is a partial schematic view of a trench power semiconductor component in the step S308 of the method shown in FIG. 2 according to one embodiment of the present disclosure.

Referring to FIG. 3F, FIG. 3F is a partial schematic view of a trench power semiconductor component in the step S308 of the method shown in FIG. 2 according to one embodiment of the present disclosure. As shown in FIG. 3F, the gate electrode 26 is formed in the arrangement space H1, and insulated from the shielding electrode 23 by the inter-electrode dielectric layer 25. In one embodiment, the gate electrode 26 is made of heavily doped polysilicon.

In the step of forming the gate electrode 26, a heavily doped polycrystalline silicon can first be formed covering the epitaxial layer 21 and filled into the arrangement space H1 disposed therein, and then the heavily doped polycrystalline silicon can be etched back so as to form the gate electrode 26. By performing the abovementioned steps S301 to S305 and S308, the trench gate structure G1 1 can be fabricated in the cell trench 21*h*.

It should be noted that in the present disclosure, in the step of forming the inter-electrode dielectric layer 25, the top portion of the heavily-doped semiconductor material 23' and the upper half portion 222*a* of the semiconductor material layer 222' are oxidized so as to form the thermal oxide layer 24, and the sidewall portions of the thermal oxide layer 24 are then removed so as to form the inter-electrode dielectric layer 25. In other words, in the embodiment of the present disclosure, the contour of the top surface of the inter-electrode dielectric layer 25 can be defined by etching the thermal oxide layer 24 to avoid the formation of recess regions on the top surface of the inter-electrode dielectric layer 25.

Unlike the conventional inter-electrode dielectric layer 12 as shown in FIG. 1, the inter-electrode dielectric layer 25 provided in the embodiment of the present disclosure does not have any recess region on the top surface thereof. Accordingly, after the gate electrode 26 is formed, the formation of the sharp protrusions at the bottom side of the gate electrode 26, which may result in lower withstand voltage and reliability of the trench power semiconductor component, can be avoided.

Additionally, in the present disclosure, the intermediate dielectric layer 221 covers the entire inner surface of the outer insulating layer 220. Accordingly, after the formation of the gate electrode 26, the gate electrode 26 can be insulated from the epitaxial layer 21 by the intermediate dielectric layer 221 and the outer insulating layer 220. Specifically, two opposite side surfaces of the gate electrode respectively connect with two opposite sidewalls of the intermediate dielectric layer 221.

To be more specific, the intermediate dielectric layer 221 can be substantially divided into an upper dielectric layer 221*b* located in the upper part of the cell trench 21*h* and an interlayer 221*a* located in the lower part of the cell trench 21*h*.

In the present embodiment, the upper dielectric layer 221*b* together with a portion of the outer insulating layer 220 serve as a gate insulating layer. Furthermore, the interlayer 221*a*, the semiconductor layer 222 and the inner dielectric layer 223 jointly form a laminated shielding layer M1.

Figure 3G:
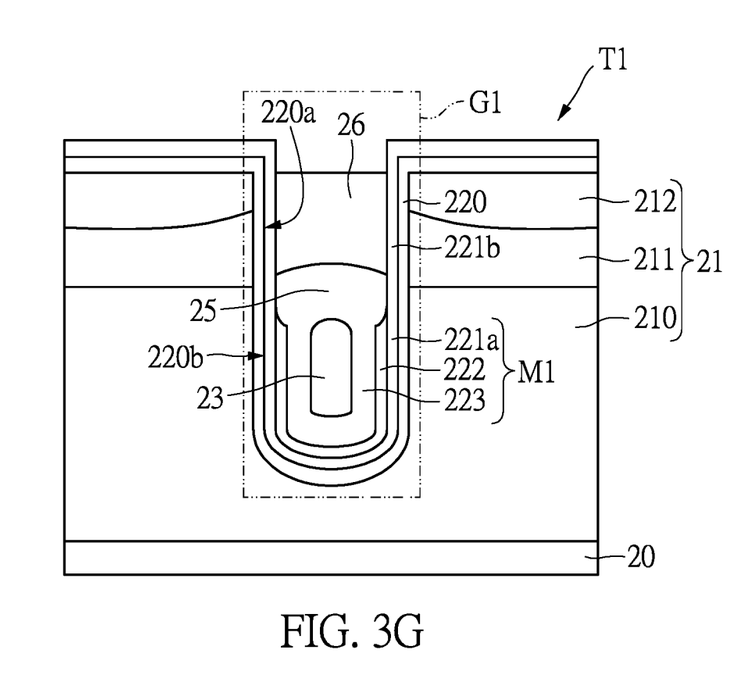
FIG. 3G is a partial schematic view of a trench power semiconductor component according to one embodiment of the present disclosure.

Next, referring to FIG. 2, in step S400, a base region and a source region are formed in the epitaxial layer. Referring to FIG. 3G, FIG. 3G is a partial schematic view of a trench power semiconductor component fabricated by the method according to one embodiment of the present disclosure.

Specifically, a base doping process is performed on the epitaxial layer 21 to form a lightly-doped region in the epitaxial layer 21, in which a conductivity type of the lightly-doped region is opposite to that of the epitaxial layer 21. Subsequently, a source doping region is performed on the lightly-doped region so as to form a heavily-doped region having a conductivity type opposite to that of the lightly-doped region. A drive-in process is then performed so that the impurities in the lightly-doped region and the impurities in the highly-doped region diffuse, thereby forming the base region 211 and the source region 212 located above the base region 211. After the formations of the base region 211 and the source region 212, a drift region 210 can be defined in the epitaxial layer 21.

Next, a redistribution layer can be formed on the epitaxial layer 21 so that the source region 212, the gate electrode 26, and the shielding electrode 23 can be electrically connected to the external control circuit. The redistribution layer can be formed by any conventional technique, and other details thereof should be easily understood by one of ordinary skill in the art according to the abovementioned embodiments and are omitted herein.

As shown in FIG. 3G, the trench power semiconductor component T1 fabricated by the steps shown in FIG. 2 includes the substrate 20, the epitaxial layer 21 and the trench gate structure G1. The epitaxial layer 21 is disposed on the substrate 20 and has at least one cell trench 21*h*. The trench gate structure G1 is disposed in the cell trench 21*h*. Specifically, the trench gate structure G1 includes the outer insulating layer 220, the shielding electrode 23, the gate electrode 26, and a laminated shielding layer M1.

The outer insulating layer 220 covers the inner wall surface of the cell trench 21*h* and has a contour that roughly matches that of the inner wall surface of the cell trench 21*h*. In the embodiment of the present disclosure, the inner surface of the outer insulating layer 220 is substantially divided into an upper inner surface 220*a* and a lower inner surface 220*b* according to a reference plane defined by the bottom edge of the base region 211.

The shielding electrode 23 together with the laminated shielding layer M1 are located in the lower part of the cell trench 21*h*. In the present embodiment, the laminated shielding layer M1 covers the lower inner surface 220*b* of the outer insulating layer 220 and surrounds the shielding electrode 23. In the present embodiment, the laminated shielding layer M1 at least includes the interlayer 221*a*, the semiconductor layer 222, and the inner dielectric layer 223.

It should be noted that the semiconductor layer 222 is spaced apart from the shielding electrode 23 by the inner dielectric layer 223, and interposed between the inner dielectric layer 223 and the interlayer 221*a*. When the semiconductor layer 222 is an intrinsic semiconductor layer, the semiconductor layer 222 can serve as an insulating layer. Furthermore, in the present embodiment, the semiconductor layer 222 is electrically floated. Therefore, even if the semiconductor layer 222 is a doped semiconductor layer, whether the semiconductor layer 222 is heavily or lightly doped, there would be no negative impact on the electrical performance of the trench power semiconductor component T1.

Referring to FIG. 2, in another embodiment of the present disclosure, after the procedures of the step S305, the method can proceed to the step S306. In the step S306, a portion of the intermediate dielectric layer is removed, and the interlayer of the intermediate dielectric layer located in the lower part of the cell trench is retained.

Figure 4A:
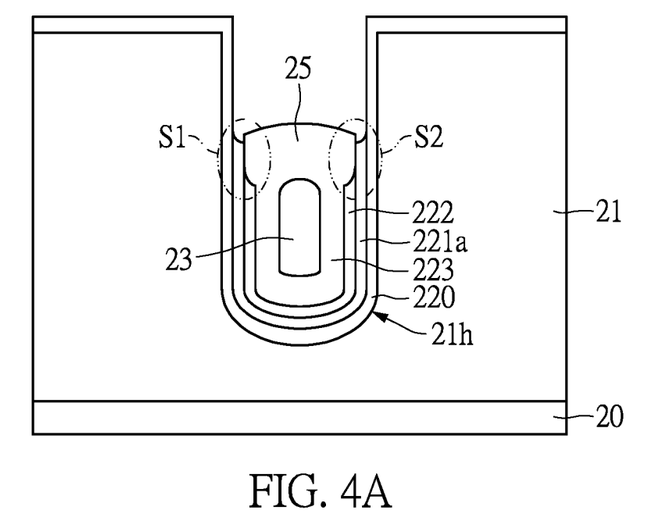
FIG. 4A is a partial schematic view of a trench power semiconductor component in the step S306 of the method shown in FIG. 2 according to another embodiment of the present disclosure.

Referring to FIG. 4A, FIG. 4A is a partial schematic view of a trench power semiconductor component in the step S306 of the method shown in FIG. 2 according to another embodiment of the present disclosure. The step shown in FIG. 4A follows the step shown in FIG. 3E.

As shown in FIG. 4A, the upper dielectric layer 221b of the intermediate dielectric layer 221 can be removed, and the interlayer 221a is retained in the lower part of the cell trench 21h. In the present embodiment, the intermediate dielectric layer 221 is of a different material from the inter-electrode dielectric layer 25 and the outer insulating layer 220. Accordingly, the upper dielectric layer 221b of the intermediate dielectric layer 221 can be removed by performing a selective etching step.

During the selective etching step, the inter-electrode dielectric layer 25 together with the outer insulating later 220 can serve as a mask to remove the upper dielectric layer 221b of the intermediate dielectric layer 221. However, the interlayer 221a is retained due to the protection of the inter-electrode dielectric layer 25 and the outer insulating later 220.

Referring to FIG. 4A, after the abovementioned steps are performed, two opposite end surfaces of the semiconductor layer 222 and two opposite end surfaces of the interlayer 221 respectively form two stepped structures on either side. That is to say, one of the two end surfaces of the semiconductor layer 222 and one of the two end surfaces of the interlayer forms a first stepped structure S1, and the other end surface of the semiconductor layer 222 and the other end surface of the interlayer 221 form a second stepped structure S2. Additionally, as shown in FIG. 4A, the inter-electrode dielectric layer 25 extends from the first stepped structure S1 in a direction parallel to the surface of the epitaxial layer 21 to the second stepped structure S2. In other words, the two opposite side surfaces of the inter-electrode dielectric layer 25 are respectively connected to the first and second stepped structures S1, S2.

Figure 4B:
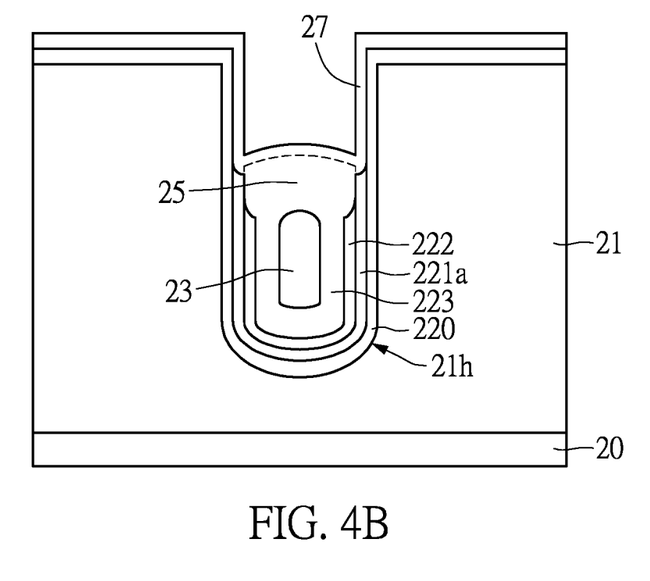
FIG. 4B is a partial schematic view of a trench power semiconductor component in the step S307 of the method shown in FIG. 2 according to another embodiment of the present disclosure.

Next, referring to FIG. 2, in step S307, an inner insulating layer is formed in the cell trench to cover the outer insulating layer. Referring to FIG. 4B, FIG. 4B is a partial schematic view of a trench power semiconductor component in the step S307 of the method shown in FIG. 2 according to another embodiment of the present disclosure.

As shown in FIG. 4B, the inner insulating layer 27 is formed in the cell trench 21h and covers the upper inner surface of the outer insulating layer 220, the top surface of the interlayer 221 and the inter-electrode dielectric layer 25. It is not necessary for the material of the inner insulating layer 27 to be the same as that of the outer insulating layer 220. Furthermore, the inner insulating layer 27 can be formed by any conventional film deposition process, such as a physical vapor deposition process or a chemical vapor deposition process. For example, the inner insulating layer 27 and the outer insulating layer 220 are made of oxide, such as silicon oxide, and the inner insulating layer 27 can be formed by performing another thermal oxidation treatment, but the present disclosure is not limited to the examples provided herein.

Figure 4C:
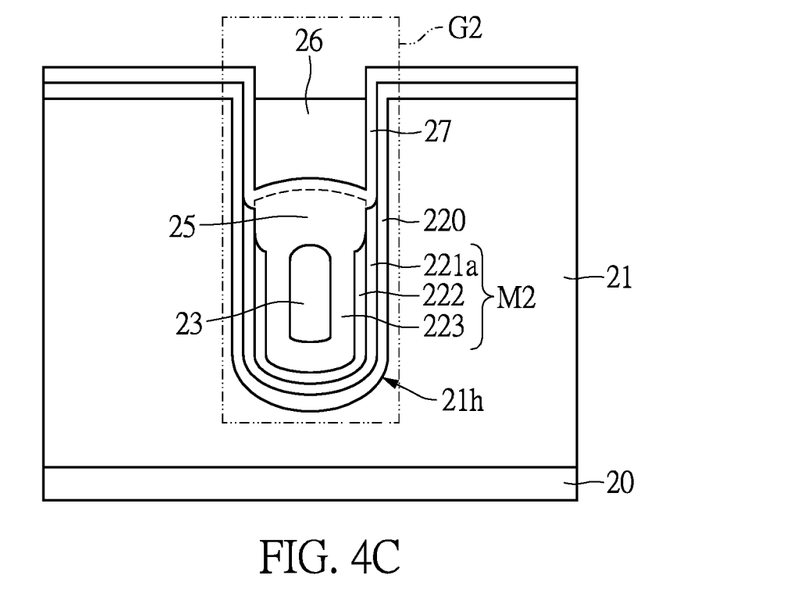
FIG. 4C is a partial schematic view of a trench power semiconductor component in the step S308 of the method shown in FIG. 2 according to another embodiment of the present disclosure.
Figure 4D:
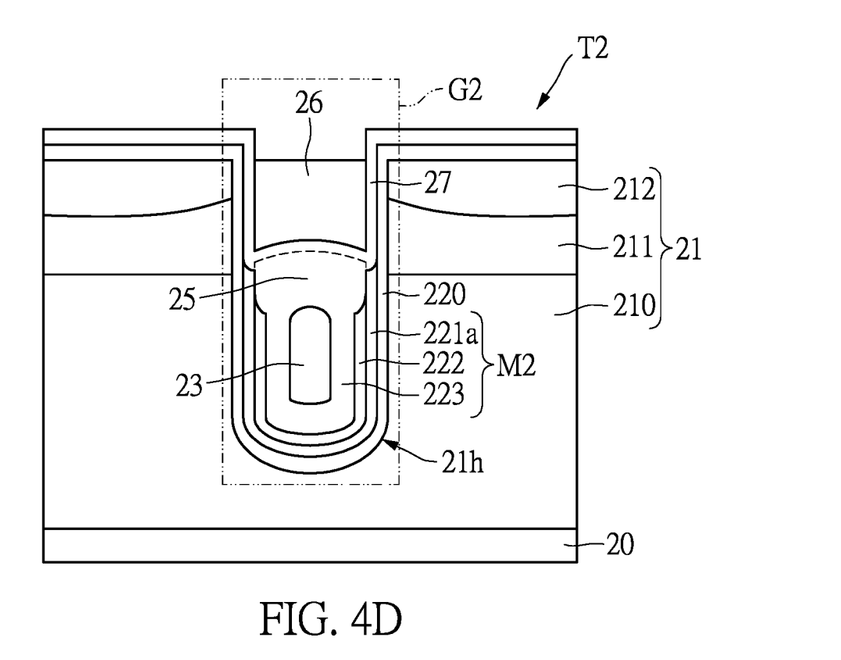
FIG. 4D is a partial schematic view of a trench power semiconductor component according to another embodiment of the present disclosure.

Referring to FIG. 4C and FIG. 4D, after the procedures of step S306 to step S308, the trench gate structure G2 of another embodiment is fabricated, as shown in FIG. 4C. Next, as shown in FIG. 4D, after the procedures of the step S400, the trench power semiconductor component T2 of another embodiment of the present disclosure is fabricated.

In the trench power semiconductor component T2 of the present embodiment, the gate electrode 26 is insulated from the epitaxial layer 21 by the outer insulating layer 220 together with the inner insulating layer 27. That is to say, the outer insulating layer 220 together with the inner insulating layer 27 can jointly serve as the gate insulating layer. The inner insulating layer 27 is connected to the interlayer 221a, and a portion thereof covers the inter-electrode dielectric layer 25.

Referring to FIG. 4A to FIG. 4C, it is worth noting that after the upper dielectric layer 221b is removed, two recesses may be formed due to a height difference between the top surface of the interlayer 221a and the top surface of the inter-electrode dielectric layer 25, as shown in FIG. 4A, and would cause two sharp protrusions to be formed at the bottom of the gate electrode 26. Accordingly, as shown in FIG. 4B, the inner insulating layer 27 can be filled in the recesses that are formed between the top surface of the interlayer 221a and the top surface of the inter-electrode dielectric layer 25. In this way, after the gate electrode 26 is formed, the formation of the sharp protrusions at the bottom of the gate electrode 26, which may result in lower reliability of the trench power semiconductor component T2, can be avoided.

It should be noted that in other embodiments, if the outer insulating layer is thick enough to avoid the formation of the recesses between the top surface of the interlayer 221a and the top surface of the inter-electrode dielectric layer 25, the method could directly proceed to step S308 after the step S306, that is, the step S307 could be omitted.

In summary, the present disclosure provides the trench power semiconductor component and the method of manufacturing the same. By performing the steps of "forming a laminated structure 22 covering the inner wall surface of the cell trench 21h before the formation of the inter-electrode dielectric layer, in which the laminated structure 22 at least includes the semiconductor material layer 222' and the initial inner dielectric layer 223' covering the semiconductor material layer 222'," "forming a heavily doped semiconductor material 23' in the lower part of the cell trench 21h," and "removing a portion of the initial inner dielectric layer 223' located at the upper part of the cell trench 21h to expose the upper half portion 222a of the semiconductor material layer 222' and the top portion of the heavily doped semiconductor material 23'," the formation of the recess region on the top surface of the inter-electrode dielectric layer 25 can be avoided. Since there is no recess region formed on the top surface of the inter-electrode dielectric layer 25, the gate electrode 26 can be formed without any sharp protrusion at the bottom thereof. In this way, the trench power semiconductor components T1, T2 fabricated by the method provided in the embodiments of the present disclosure can withstand higher gate voltage and have higher reliability.

Furthermore, each of the trench gate structures G1, G2 of the trench power semiconductor components T1, T2 has the semiconductor layer 222 that is positioned at the lower part thereof and surrounds the shielding electrode 23.

The description illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A trench power semiconductor component, comprising:
    a substrate;
    an epitaxial layer disposed on the substrate, the epitaxial layer having at least one cell trench formed therein; and
    a trench gate structure disposed in the cell trench, wherein the trench gate structure includes:
        an outer insulating layer covering an inner wall surface of the cell trench;
        a shielding electrode located in a lower part of the cell trench;
        a gate electrode disposed above the shielding electrode and insulated from the shielding electrode; and
        a laminated shielding layer covering a lower inner surface of the outer insulating layer, wherein the laminated shielding layer at least includes a semiconductor layer that is spaced apart from the shielding electrode and interposed between the lower inner surface and the shielding electrode;
        wherein two lateral sides of the shielding electrode are surrounded by the semiconductor layer.

2. The trench power semiconductor component according to claim 1, wherein the semiconductor layer is an intrinsic semiconductor layer or a doped semiconductor layer.

3. The trench power semiconductor component according to claim 1, wherein the laminated shielding layer further includes an inner dielectric layer interposed between the shielding electrode and the semiconductor layer.

4. The trench power semiconductor component according to claim 1, wherein the shielding electrode and the semiconductor layer at least partially overlap with each other in a direction perpendicular to an extending direction of the cell trench along a surface of the epitaxial layer.

5. The trench power semiconductor component according to claim 1, wherein the laminated shielding layer further includes an interlayer interposed between the outer insulating layer and the semiconductor layer.

6. The trench power semiconductor component according to claim 5, wherein two opposite end surfaces of the semiconductor layer and two opposite end surfaces of the interlayer are respectively formed with two stepped structures on either side.

7. The trench power semiconductor component according to claim 6, wherein the trench gate structure further includes an inter-electrode dielectric layer interposed between the gate electrode and the shielding electrode so as to isolate the gate electrode from the shielding electrode, and two opposite sidewall surfaces of the inter-electrode dielectric layer are respectively connected to two stepped structures.

8. The trench power semiconductor component according to claim 5, wherein the trench gate structure further includes an inner insulating layer covering an upper inner surface of the outer insulating layer, the inner insulating layer is connected to the interlayer, and the gate electrode is insulated from the epitaxial layer by the outer insulating layer together with the inner insulating layer.

9. The trench power semiconductor component according to claim 8, wherein the material of the inner insulating layer is different from that of the interlayer and a portion of the inner insulating layer covers the inter-electrode dielectric layer.

10. The trench power semiconductor component according to claim 5, wherein the trench gate structure further includes an upper dielectric layer covering an upper inner surface of the outer insulating layer, the material of the upper dielectric layer is the same as that of the interlayer, and the upper dielectric layer and the interlayer are connected to each other so as to form an intermediate dielectric layer.

11. A method of manufacturing a trench power semiconductor component, comprising:
    forming an epitaxial layer on a substrate;
    forming a cell trench in the epitaxial layer; and
    forming a trench gate structure in the cell trench, the trench gate structure including a shielding electrode, a gate electrode disposed above the shielding electrode, and an inter-electrode dielectric layer interposed between the shielding electrode and the gate electrode;
    wherein before the inter-electrode dielectric layer is formed, the step of forming the trench gate structure in the cell trench further includes:
        forming a laminated structure covering an inner wall surface of the cell trench, wherein the laminated structure at least includes a semiconductor material layer and an initial inner dielectric layer covering the semiconductor material layer;
        forming a heavily-doped semiconductor material in a lower part of the cell trench; and
        removing a part of the initial inner dielectric layer located in an upper part of the cell trench to expose an upper half portion of the semiconductor material layer and a top portion of the heavily doped semiconductor material.

12. The method according to claim 11, wherein the step of forming the trench gate structure further includes:
    performing a thermal oxidation process so that the top portion of the heavily doped semiconductor material and the upper half portion of the semiconductor material layer are oxidized to form a thermal oxide layer, wherein the other un-oxidized portion of the heavily doped semiconductor material forms the shielding electrode, the thermal oxide layer includes a sidewall portion and an isolation portion disposed on the shielding electrode, in which the isolation portion has a thickness greater than the sidewall portion;
    removing the sidewall portion and a part of the isolation portion located on the shielding electrode to form the inter-electrode dielectric layer; and
    forming a gate electrode in the upper part of the cell trench.

13. The method according to claim 12, wherein the laminated structure further includes an outer insulating layer and an intermediate dielectric layer, and the intermediate dielectric layer and the semiconductor material layer are disposed between the outer insulating layer and the initial inner dielectric layer.

14. The method according to claim 13, wherein after the step of forming the gate electrode, two opposite side surfaces of the gate electrode are respectively connected to two opposite sidewalls of the intermediate dielectric layer.

15. The method according to claim 13, wherein before the step of forming the gate electrode, the step of trench gate structure further includes:
    after the step of removing the sidewall portion and the part of the isolation portion located on the shielding electrode, removing a portion of the intermediate dielectric layer, in which the intermediate dielectric layer located in the lower part of the cell trench is left un-etched and forms the interlayer, wherein two opposite end surfaces of the semiconductor layer and two opposite end surfaces of the interlayer are respectively formed with two stepped structures on either side; and forming an inner insulating layer in the cell trench to cover the outer insulating layer.

16. The method according to claim 11, wherein the semiconductor material layer is an intrinsic semiconductor layer or a doped semiconductor layer.

17. The method according to claim 11, further comprising: after the step of forming the trench gate structure, forming a base region and a source region in the epitaxial layer.

18. A trench power semiconductor component, comprising:
   a substrate;
   an epitaxial layer disposed on the substrate, the epitaxial layer having at least one cell trench formed therein; and
   a trench gate structure disposed in the cell trench, wherein the trench gate structure includes:
      an outer insulating layer covering an inner wall surface of the cell trench;
      a shielding electrode located in a lower part of the cell trench;
      a gate electrode disposed above the shielding electrode and insulated from the shielding electrode; and
      a laminated shielding layer covering a lower inner surface of the outer insulating layer, wherein the laminated shielding layer at least includes a semiconductor layer and an interlayer, the semiconductor layer is spaced apart from the shielding electrode and interposed between the lower inner surface and the shielding electrode, the interlayer is interposed between the outer insulating layer and the semiconductor layer;
   wherein two opposite end surfaces of the semiconductor layer and two opposite end surfaces of the interlayer are respectively formed with two stepped structures on either side.

* * * * *